United States Patent [19]
Campardo et al.

[11] Patent Number: 6,018,255
[45] Date of Patent: Jan. 25, 2000

[54] LINE DECODER FOR MEMORY DEVICES

[75] Inventors: Giovanni Campardo, Bergamo; Rino Micheloni, Turate; Stefano Commodaro, Bogliasco, all of Italy

[73] Assignee: STMicroelectronics S.r.l., Agrate Brianza, Italy

[21] Appl. No.: 08/862,563

[22] Filed: May 23, 1997

[30] Foreign Application Priority Data

May 24, 1996 [EP] European Pat. Off. .............. 96830299

[51] Int. Cl.[7] .............................................. H03K 19/082
[52] U.S. Cl. ............................ 326/105; 326/121; 326/80
[58] Field of Search .................................... 326/105, 106, 326/108, 112, 115, 119, 121, 80–81, 68

[56] References Cited

U.S. PATENT DOCUMENTS

| | | | |
|---|---|---|---|
| 4,642,798 | 2/1987 | Rao | 365/230 |
| 4,694,430 | 9/1987 | Rosier | 365/189 |
| 4,791,612 | 12/1988 | Yoshida | 365/189 |
| 4,893,275 | 1/1990 | Tanaka et al. | 365/189.09 |
| 5,039,882 | 8/1991 | Arakawa | 326/106 |
| 5,311,479 | 5/1994 | Harada | 326/106 |

FOREIGN PATENT DOCUMENTS 2 127 642   4/1984   United Kingdom .

*Primary Examiner*—Michael Tokar
*Assistant Examiner*—Don Phu Le
*Attorney, Agent, or Firm*—David V. Carlson; Robert Iannucci; Seed and Berry LLP

[57] ABSTRACT

The row decoder includes a predecoding stage supplied with row addresses and generating predecoding signals; and a final decoding stage, which, on the basis of the predecoding signals, drives the individual rows in the array. The predecoding stage includes a number of predecoding circuits presenting two parallel signal paths: a low-voltage path used in read mode, and a high-voltage path used in programming mode. A CMOS switch separates the two paths, is driven by high voltage via a voltage shifter in programming mode, and, being formed at predecoding level, involves no integration problems.

21 Claims, 4 Drawing Sheets

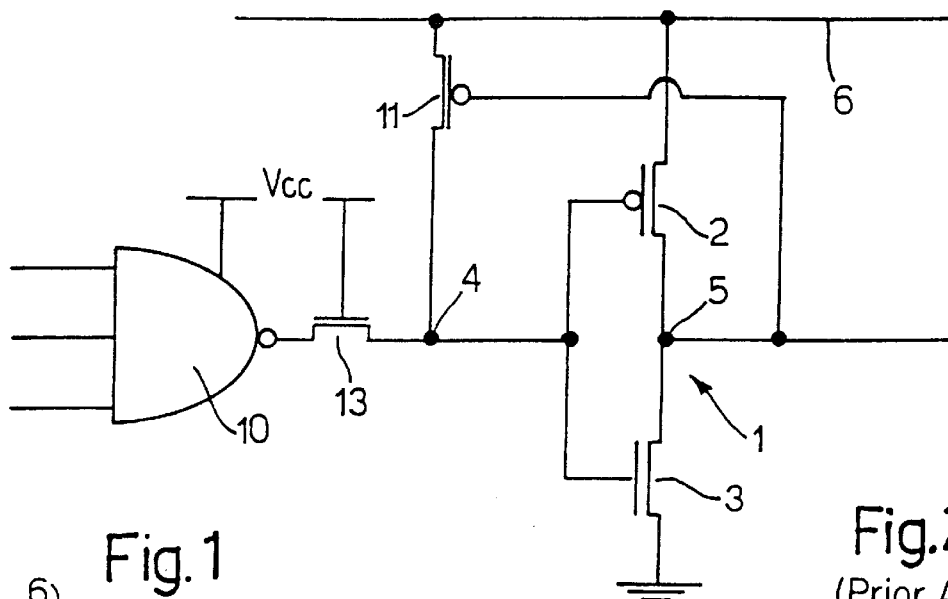
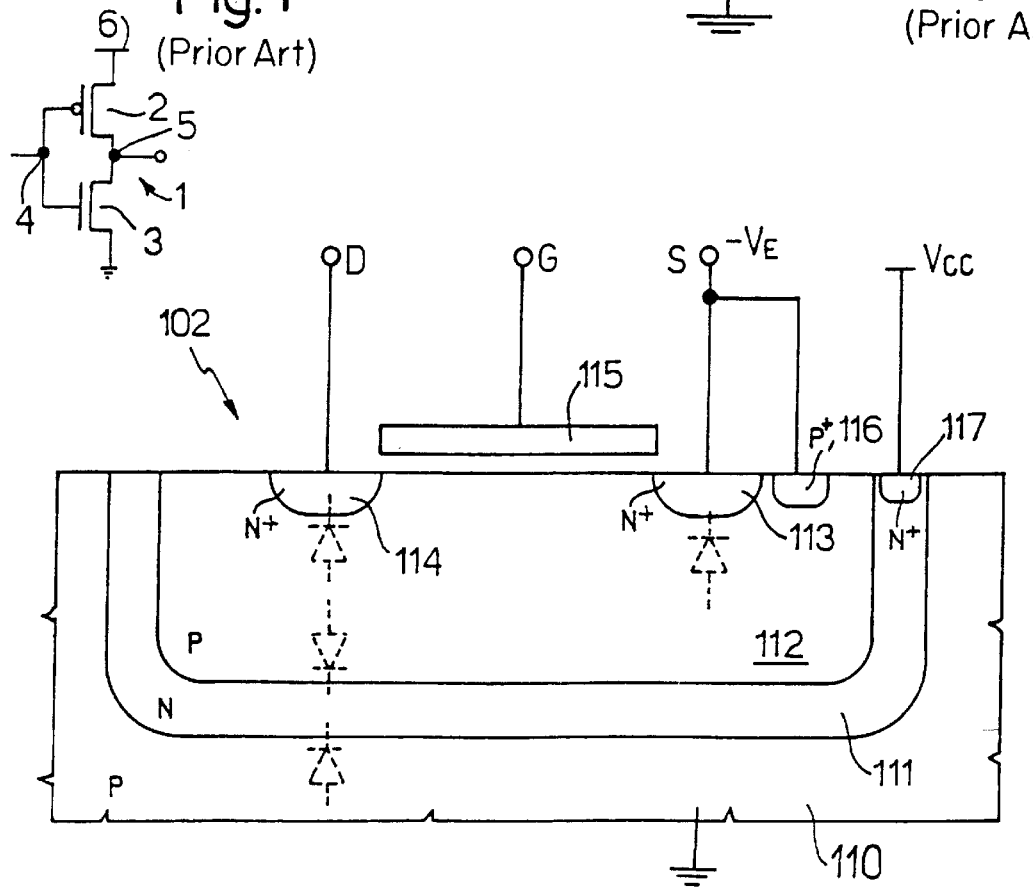
Fig.1 (Prior Art)
Fig.2 (Prior Art)
Fig.6

LINE DECODER FOR MEMORY DEVICES

TECHNICAL FIELD

The present invention relates to a line decoder for memory devices. In the following description, reference is made purely by way of example to a row decoder, the term "line" being intended to mean a row or column in the memory.

BACKGROUND OF THE INVENTION

As is known, row decoders provide for addressing individual rows in a memory array according to the coded address with which they are supplied. The basic scheme of row decoders may be represented by a number of inverters (one for each row) controlled by a combinatorial circuit, which receives the input addresses and drives the inverters so that only one of them at a time presents a high output. More specifically, the combinatorial circuit provides for supplying a low logic signal to the inverter connected to the selected row (so that the inverter presents a high output) and a high logic signal to all the others. One such inverter is shown in FIG. 1, which shows an inverter 1 comprising a PMOS pull-up transistor 2 and an NMOS pull-down transistor 3 with the gate terminals connected to each other (node 4), the drain terminals connected to each other (output node 5), and the source terminals connected respectively to supply line 6 and ground.

The simplified arrangement described above operates correctly in read mode, wherein both the combinatorial circuit and the inverters present read voltage $V_{cc}$ as the high logic level, but not in programming mode, in which case, the combinatorial circuit supplies read voltage $V_{cc}$ as the high logic level at input 4 of the nonselected-row inverters, whereas supply line 6 is at programming voltage $V_{pp} > V_{cc}$. As such, a voltage drop of other than zero exists between the gate and source terminals of pull-up transistors 2 of inverters 1, and, if this reaches the threshold value (threshold voltage) of transistors 2, these are turned on, and outputs 5 of the inverters are prevented from reaching the zero voltage value required to prevent stressing the connected cells and to ensure a correct logic level at the output.

One possible solution to the problem is to use a positive-feedback inverter with a PMOS feedback transistor connected between line 6 and input 4, and with the gate terminal connected to output 5.

As such, when the voltage at output 5 falls, the feedback transistor is turned on and connects node 4 to the programming voltage $V_{pp}$ of line 6, thus ensuring complete turn-off of pull-up transistor 2 and a zero output voltage.

The above solution, however, also presents drawbacks of its own. In the first place, layout problems arise owing to the output of the inverter having to be fed back, and solving the problem by driving the feedback transistor with a separate signal in turn creates problems in terms of synchronization. Secondly, problems arise as regards direct biasing of the drain-bulk junction of the PMOS transistors of NAND gate 10, which would have the source and bulk regions biased at $V_{cc}$ and the drain regions (connected to the output) biased at $V_{pp}$. One possible solution to the problem is to provide an NMOS pass transistor or CMOS pass switch to separate the low-voltage (predecoding) portion from the high-voltage (actual decoding) portion.

Such a solution is shown in FIG. 2 wherein a three-input NAND gate 10, supplied at read voltage $V_{cc}$ and forming part of the combinatorial circuit for selecting the row, drives inverter 1 via an NMOS pass transistor 13 with the gate terminal biased at $V_{cc}$; and output node 5 is connected to the gate terminal of a PMOS feedback transistor 11 with the source terminal connected to line 6 and the drain terminal connected to node 4.

In the FIG. 2 solution, when the output of NAND gate 10 is high ($V_{cc}$), pass transistor 13 operates as a diode by presenting two terminals (the gate terminal and the terminal connected to the output of NAND gate 10) at the same voltage, and therefore causes, between the output of NAND gate 10 and node 4, a voltage drop equal to its threshold voltage.

In addition to further complicating the circuitry, the FIG. 2 solution is therefore also unsatisfactory in the presence of low supply voltage, in which case, the voltage drop across pass transistor 13 prevents node 4 from reaching the high voltage required to ensure pull-up transistors 2 are turned off completely.

Moreover, besides merely shifting the problem of undesired biasing to other parts of the circuit, a CMOS pass switch is too bulky to be accommodated in the decoding stage, which is formed within the spacing between the array rows.

SUMMARY OF THE INVENTION

It is an object of the present invention to provide a line decoder which operates correctly both in read and programming mode, even in the event of low supply voltage, and which involves no problems in terms of layout or synchronization.

According to the present invention, there is provided a line decoder for memory devices. In practice, when the line decoder is a row decoder, it comprises a predecoding stage supplied with row addresses and generating predecoding signals; and an actual (final) decoding stage, which, on the basis of the predecoding signals, provides for driving the individual rows in the array. In the row decoder according to the present invention, the high (programming) voltage is supplied not only to the final decoding stage but also to the predecoding stage, for which purpose, the predecoding stage presents two parallel paths, one supplied with low voltage and used in read mode, and the other supplied with high voltage and used in programming mode. A CMOS switch separates the two paths, is driven by the high voltage already available in the predecoding stage, and, being formed at predecoding level, involves none of the integration problems posed by the final decoding stage. Similarly, when the line decoder is a column decoder comprising a single decoding stage corresponding to the predecoding stage of the row decoder, it comprises two separate paths supplied respectively with low and high voltage, and selectively enabled by a CMOS switch.

Using two separate paths provides, on the one hand, for solving the problems mentioned previously, and, on the other, for achieving extremely fast read access times. In fact, the low-voltage path (used in read mode) may be so designed as to ensure highly fast address times with no need for appropriate voltage shift structures, and the high-voltage path for effecting the voltage shift required for programming.

BRIEF DESCRIPTION OF THE DRAWINGS

A preferred, non-limiting embodiment of the present invention will be described by way of example with reference to the accompanying drawings, in which:

FIG. 1 shows a diagram of a known decoding inverter;

FIG. 2 shows a simplified diagram of a different known decoding circuit;

FIG. 6 shows a cross section of part of a wafer of semiconductor material integrating an NMOS transistor.

DETAILED DESCRIPTION OF THE INVENTION

Figure 3:
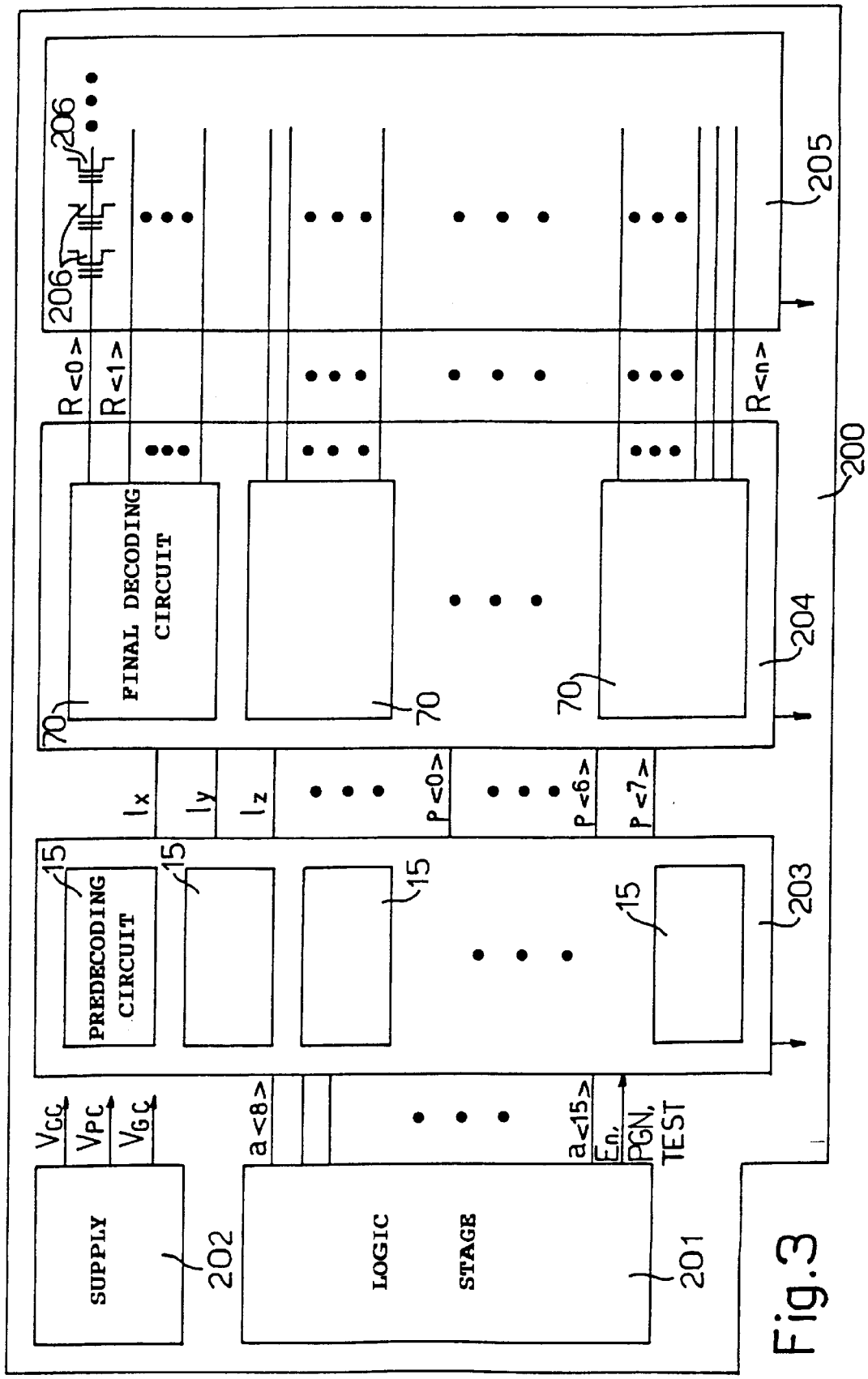
FIG. 3 shows the architecture of a memory device comprising the row decoder according to the invention.

Memory device 200 in FIG. 3 comprises a conventional logic stage 201 for generating all the internal signals of the memory, including addresses a<o>–a<15> and control signals En, TEST, PGR; a conventional supply stage 202 for generating supply voltages $V_{cc}$, VPC, VGC; a predecoding stage 203, which, on the basis of addresses a<8>–a<15>, generates predecoding signals 1x<0–3>, 1y<0–3>, 1z<0–3> and p<0>–p<7>; a final decoding stage 204, which, on the basis of the predecoding signals, generates row biasing signals R<0>–R<n>; and a memory array 205 comprising a number of (e.g., flash) memory cells 206 arranged in rows and columns.

Predecoding stage 203 comprises a number of predecoding circuits 15 that are identical to one another but receiving different combinations of straight or inverted address signals; and, similarly, final decoding stage 204 comprises a number of final decoding circuits 70 that are identical to one another but receiving different combinations of signals 1x, 1y, 1z and p.

Figure 4:
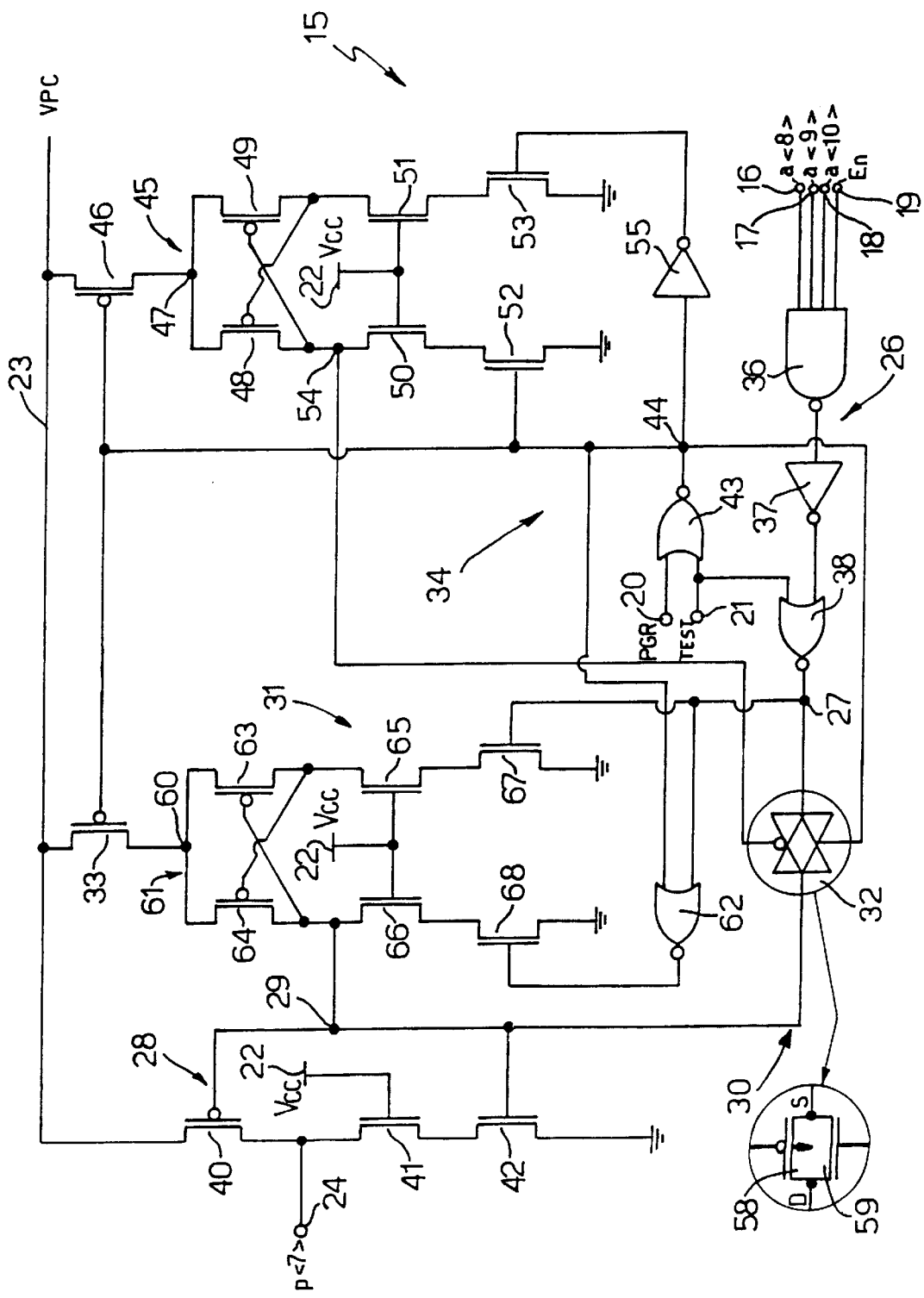
FIGS. 4 and 5 show respective diagrams of a predecoding circuit and decoding circuit forming the decoder according to the invention.

FIG. 4 shows circuit 15 generating a signal p<7> on the basis of addresses a<8>, a<9> and a<10>.

Circuit 15 comprises three input nodes 16–18 receiving respective row addresses a<8>, a<9> and a<10>; an input node 19 receiving an inverted erase enabling signal En; an input node 21 receiving a TEST signal; an input node 20 receiving a program enabling signal PGR; a first low-voltage supply line 22 at $V_{cc}$ (e.g., between 3 and 5 V); a second supply line 23 at voltage VPC, which, in read mode, equals $V_{cc}$, and, in programming mode, is at high programming voltage $V_{pp}$ (e.g., 12 V); and an output node 24 supplying predecoding signal p<7>.

Circuit 15 presents an input branch 26 connected between address input nodes 16–18 and a node 27; an output branch 28 connected between a node 29 and output node 24; two separate parallel paths 30, 31 connected between nodes 27 and 29; a CMOS switch 32 for enabling path 30; a switch 33 for enabling path 31; and a control stage 34 for controlling switches 32, 33.

Path 30, substantially comprising a connecting line, is a low-voltage path used in read mode for grounding or supplying voltage $V_{cc}$ to node 29 according to the requirements; and path 31, substantially comprising a voltage shifter, is a high-voltage path connected to second supply line 23 via switch 33, and used in programming mode (when required) to supply high voltage $V_{pp}$ to node 29.

Input branch 26 comprises a NAND gate 36 with four inputs connected to input nodes 16–19 of circuit 15; an inverter 37 connected to the output of NAND gate 36; and a NOR gate 38 with an input connected to the output of inverter 37, an input connected to input 21 of circuit 15, and an output defining node 27.

Output branch 28 comprises a PMOS transistor 40 and two NMOS transistors 41, 42 connected in series between second supply line 23 and ground. More specifically, transistor 40 has the gate terminal connected to node 29, the source terminal connected to line 23, and the drain terminal connected to output node 24; transistor 41 has the drain terminal connected to output node 24, the gate terminal connected to first supply line 22, and the source terminal connected to the drain terminal of transistor 42; and transistor 42 has the gate terminal connected to node 29, and the source terminal grounded.

Control stage 34 comprises a NOR gate 43 with two inputs connected to input nodes 20, 21, and an output defining a node 44; a voltage shifter 45; and a PMOS transistor 46 operating as a switch for enabling shifter 45. More specifically, transistor 46 has the source terminal connected to second supply line 23, the gate terminal connected to node 44, and the drain terminal connected to a node 47 of shifter 45; shifter 45 comprises two PMOS transistors 48, 49, and four NMOS transistors 50–53; transistor 48 has the source terminal connected to node 47, the gate terminal connected to the drain terminal of transistor 49, and the drain terminal connected to a node 54; transistor 50 has the drain terminal connected to node 54, the gate terminal connected to first supply line 22, and the source terminal connected to the drain terminal of transistor 52; transistor 52 has the gate terminal connected to node 44, and the source terminal grounded; transistor 49 has the source terminal connected to node 47, the gate terminal connected to node 54, and the drain terminal connected to the drain terminal of transistor 51; transistor 51 has the gate terminal connected to first supply line 22, and the source terminal connected to the drain terminal of transistor 53; and transistor 53 has the gate terminal connected to node 44 via an inverter 55, and the source terminal grounded.

As shown in the enlarged detail, CMOS switch 32 comprises a PMOS transistor 58 and an NMOS transistor 59 having the source terminals connected to each other and to node 27, the drain terminals connected to each other and to node 29 over path (line) 30, and the gate terminals connected respectively to node 54 and node 44. In a manner not shown in detail, the bulk of PMOS transistor 58 is connected to second supply line 23; and the bulk of NMOS transistor 59 is grounded.

Switch 33 comprises a PMOS transistor with the source terminal connected to second supply line 23, the gate terminal connected to node 44, and the drain terminal connected to a node 60 of second path 31, which comprises a shifter 61, similar to shifter 45, and a NOR gate 62. More specifically, shifter 61 comprises two PMOS transistors 63, 64, and four NMOS transistors 65–68; transistor 63 has the source terminal connected to node 60, the gate terminal connected to node 29, and the drain terminal connected to the drain terminal of transistor 65; transistor 65 has the gate terminal connected to first supply line 22, and the source terminal connected to the drain terminal of transistor 67; transistor 67 has the gate terminal connected to node 27, and the source terminal grounded; transistor 64 has the source terminal connected to node 60, the gate terminal connected to the drain terminal of transistor 63, and the drain terminal connected to node 29; transistor 66 has the drain terminal connected to node 29, the gate terminal connected to first supply line 22, and the source terminal connected to the drain terminal of transistor 68; transistor 68 has the gate terminal connected to the output of NOR gate 62, and the source terminal grounded; and NOR gate 62 has one input connected to node 27, and one input connected to node 44.

In known manner (not shown), all the logic gates of circuit 15 illustrated by the equivalent combinatorial symbol are supplied by first supply line 22 at $V_{cc}$, and may therefore be considered connecting elements between line 22 and other parts of the circuit. This applies in particular to NOR gate 38, which, when it presents a high output and switch 32 is closed (as will be seen in detail later on), defines a connecting element between first supply line 22 at $V_{cc}$ and first path 30.

Circuit 15 in FIG. 4 operates as follows. Inverted erase enabling signal En is always high except in erase mode, and the TEST signal is always low except in test mode.

In read mode, signal PGR is low, so that node 44 is high, disables switches 33 and 46 (high-voltage path 31 off and shifters 45, 61 supplied solely by first supply line 22), and enables switch 32, so that a high logic signal (at voltage $V_{cc}$) is supplied to the gate terminal of transistor 59, and a low signal is supplied to the gate terminal of transistor 58, by virtue of transistors 52, 50 being turned on and maintaining node 54 grounded. Switch 32 is therefore closed with no voltage drop at its terminals, so that, if the address signals at input nodes 16–18 are all high, the output of NAND gate 36 and node 27 are low, transistor 42 is turned off, as is transistor 41 which has a floating terminal, transistor 40 is turned on, node 24 is connected directly to second supply line 23 at VPC, and signal p<7> is high and equals $V_{cc}$ (being in read mode). Conversely, if even only one of the address signals is low, transistors 42, 41 are turned on and ground node 24, and signal p<7> is low.

In programming mode, signal PGR is high; node 44 is grounded and drives transistors 33, 46 to enable voltage shifters 45, 61; voltage VPC of second supply line 23 is high (equal to $V_{pp}$) so that nodes 47, 60 are connected to the high voltage; the low signal at node 44 keeps transistor 52 and transistor 50 (which has a floating source terminal) turned off; the output of inverter 55 is high and so keeps transistor 53 turned on; transistors 51, 48 are therefore also turned on; node 54 is high, at voltage $V_{pp}$; CMOS switch 32, receiving a low signal at the NMOS transistor 59 side and a high-voltage signal (at $V_{pp}$) at the PMOS transistor 58 side, is definitely turned off, even in the presence of a high signal (at $V_{pp}$) at node 29, thus definitely ensuring low-voltage path 30 is disabled; and connection of the bulk of transistor 58 to VPC (i.e., $V_{pp}$) prevents undesired direct biasing between the various regions of transistor 58.

Conversely, high-voltage path 31 is enabled by switch 33, so that, when all the address signals and enabling signal En at input nodes 16–19 are high and, hence, in the presence of a low signal at node 27, transistor 67 is turned off, NOR gate 62 receives two zeroes, so that transistor 68 is turned on; node 29 is therefore low; transistors 41, 42 are turned off; transistor 40 is turned on; and signal p<7> at node 24 is high and equals $V_{pp}$. If, on the other hand, even only one of the address signals at input nodes 16–18 is low, the high signal at node 27 turns transistor 67 on and transistor 68 off; node 29 is high and equal to $V_{pp}$; transistor 40 is turned off completely; transistors 41, 42 are turned on; and signal p<7> is low.

In erase mode (signals En, TEST and PGR low), in all the circuits 15 receiving a low enabling signal En, CMOS switch 32 is closed; the output of NAND gate 36 and node 29 are high; and signals p<0>–p<7>, 1x, 1y, 1z are low.

Figure 5:
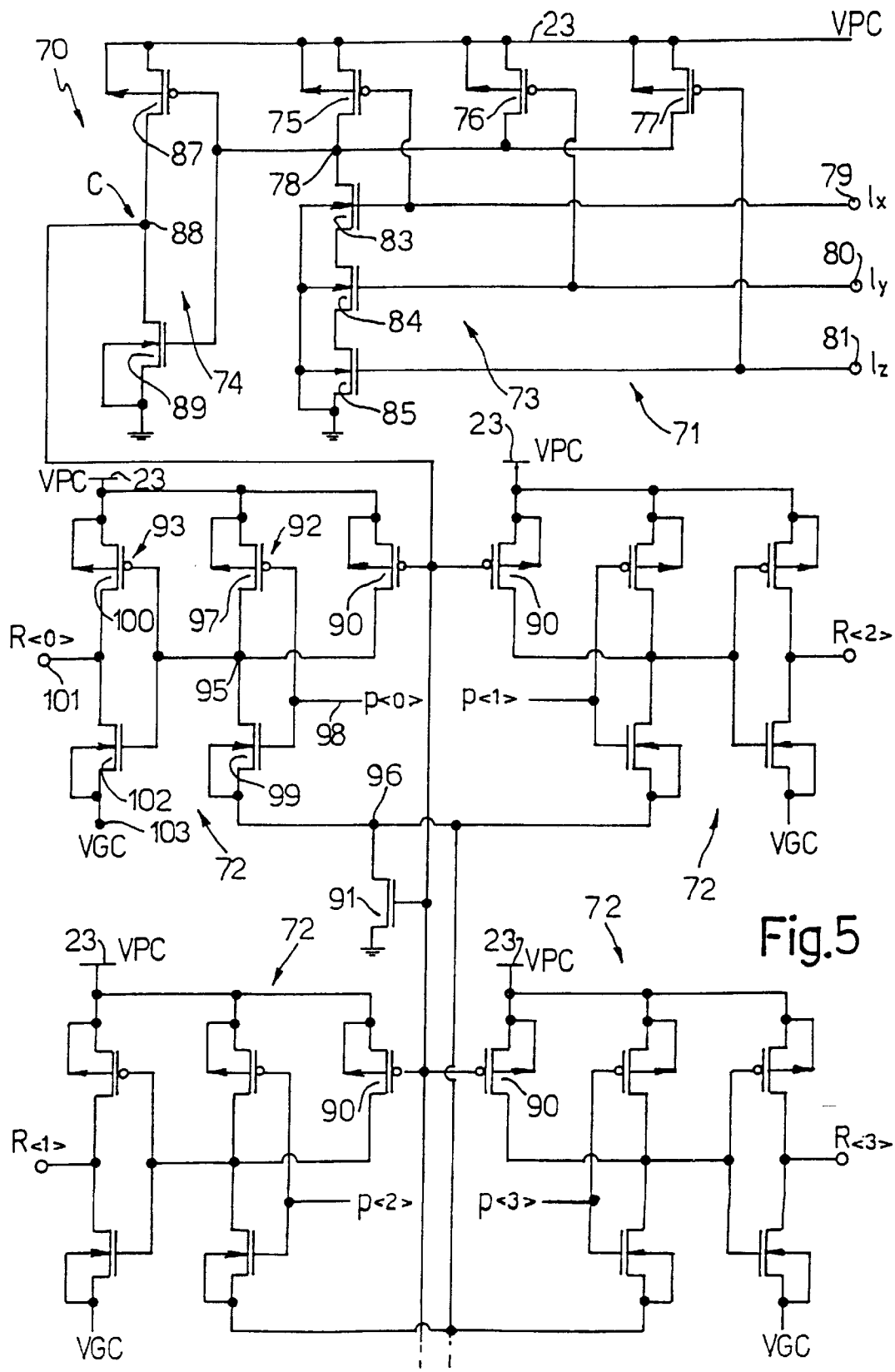

FIG. 5 shows a final decoding circuit 70 for generating row biasing signals R<0>–R<7> on the basis of signals 1x, 1y, 1z and p<0> to p<7> (the drive circuits generating signals R<4>–R<7> are not shown).

Circuit 70, connected between second supply line 23 at VPC and ground, comprises an input stage 71 receiving signals 1x, 1y, 1z and supplying an enabling signal C for enabling eight identical drive circuits 72, of which only four are shown.

Input stage 71 substantially comprises a NAND gate 73 and an inverter 74. NAND gate 73 comprises three PMOS transistors 75–77 and three NMOS transistors 83–85; transistors 75–77 have the source terminals connected to second supply line 23, the drain terminals connected to a node 78, and the gate terminals connected to respective inputs 79, 80, 81 receiving signals 1z, 1y, 1z; and transistors 83–85 are connected in series between node 78 and ground, and have the gate terminals connected to respective inputs 79–81. Inverter 74 comprises a PMOS transistor 87 with the source terminal connected to second supply line 23, the gate terminal connected to node 78, and the drain terminal connected to a node 88 presenting signal C; and an NMOS transistor 89 with the drain terminal connected to node 88, the gate terminal connected to node 78, and the source terminal grounded.

Each drive circuit 72 comprises a PMOS disabling transistor 90, a first inverter 92, and a second inverter 93, and an NMOS enabling transistor 91 drives a number of drive circuits 72. Each PMOS disabling transistor 90 has the source terminal connected to second supply line 23, the gate terminal connected to node 88, and the drain terminal connected to a respective node 95; NMOS enabling transistor 91 has the drain terminal connected to a common node 96, the gate terminal connected to node 88, and the source terminal grounded; each first inverter 92 comprises a PMOS transistor 97 and an NMOS transistor 99; each transistor 97 has the source terminal connected to second supply line 23, the gate terminal connected to a respective input node 98 receiving a respective signal p, and the drain terminal connected to respective node 95, which therefore defines the output of respective inverter 92; each NMOS transistor 99 has the drain terminal connected to respective node 95, the gate terminal connected to respective input 98, and the source terminal connected to common node 96; each second inverter 93 comprises a PMOS transistor 100 and an NMOS transistor 102; each transistor 100 has the source terminal connected to second supply line 23, the gate terminal connected to respective node 95, and the drain terminal connected to a respective output node 101; each transistor 102 has the drain terminal connected to respective node 101, the gate terminal connected to respective node 95, and the source terminal connected to a respective node 103 at which voltage VGC equal to zero (ground) is supplied in read and programming mode, and voltage VGC equal to a high negative voltage $-V_E$ is supplied when erasing the memory device cells.

Circuit 70 in FIG. 5 operates as follows. When all three signals 1x, 1y, 1z are high, NMOS transistors 83–85 are turned on, PMOS transistors 75–77 are turned off, node 78 is low, and signal C at node 88 is high (at voltage VPC). Conversely, if even only one of signals 1x, 1y, 1z is low, the corresponding NMOS transistor is turned off, the corresponding PMOS transistor is turned on, node 78 is connected to second supply line 23, and signal C is low (grounded).

When signal C is high, the disabling transistors 90 of all the drive circuits 72 are turned off and leave nodes 95 free; enabling transistor 91, on the other hand, is turned on and grounds node 96 to enable inverters 92; the drive circuit 72 receiving a high signal at respective input 98 therefore presents a low node 95 and a high node 101 (signal R at VPC, equal to voltage $V_{cc}$ in read mode and $V_{pp}$ in programming mode); and the other drive circuits 72 connected to the same input stage 71 and receiving low signals at respective inputs 98 present high nodes 95 and low nodes 101.

When signal C is low, the disabling transistors 90 of all the drive circuits 72 are turned on and connect respective nodes 95 to second supply line 23; enabling transistor 91 is turned off and leaves the source terminals of transistors 99 floating; and all the drive circuits 72 therefore present low output signals (at respective nodes 101).

As stated, in erase mode, signals 1x, 1y, 1z, p<0>–p<7> are all low, so that nodes 95 are all high; and NMOS transistors 102 of pull-down inverters 93 are turned on and transfer the high negative voltage $-V_E$ at inputs 103 to the rows in the array. For transistors 102 to operate correctly, with no undesired reverse biasing of the substrate-source junctions, and without using decoupling transistors, transistors 102 are formed using the triple-well technology shown in FIG. 6.

In FIG. 6, a P-type substrate 110 houses an N-well 111 in turn housing a P-well 112 defining the bulk of transistor 102; and well 112 houses the $N^+$ type regions 113, 114 defining the source and drain regions of transistor 102, and is anchored electrically to source region 113. FIG. 6 also shows the gate region 115 of transistor 102; an $N^{30}$ well 116 contacting the bulk; and a $P^+$ well 117 contacting well 111, which is biased at voltage $V_{cc}$, so that, when source region 113 of transistor 102 is biased at erase voltage $-V_E$, well 112 is also biased at the same negative voltage, and no voltage drop occurs at junction 112–113. Similarly, junctions 112–114, 111–112 and 110–111 are reverse biased and therefore pose no problems.

The advantages of the circuit described are as follows. In particular, it operates correctly even at low voltage, by featuring no NMOS pass transistors or other components involving a voltage drop at the terminals. It ensures correct output readings, and prevents stressing the cells connected to the nonselected rows, by featuring supply branches ensuring the components along the transmission paths of the row drive signals are turned off or on completely. The formation of a high-voltage path in the predecoding circuit enables the use of a CMOS pass switch, which, despite presenting no voltage drop, requires a high-voltage drive circuit for it to operate correctly, and is too bulky to be accommodated in the final decoding circuit, the components of which are formed within the spacing between the array rows and must therefore be small in size. Despite the use of numerous high-voltage components, the layout of the decoder according to the invention is simplified by requiring no feedback branches.

Finally, by forming two separate paths in the predecoding circuit, the low-voltage path may be extremely simple (merely a connecting line) to greatly reduce access time, and the high-voltage path may be optimized using voltage shifters, which in themselves introduce a slight delay in signal propagation, at no expense in terms of read performance.

Clearly, changes may be made to the decoder as described and illustrated herein without, however, departing from the spirit and scope of the present invention. In particular, the structure described of the predecoding circuit, with two parallel, differently supplied paths, may also be implemented, with the same advantages, for forming a column decoder (which requires no final decoding circuit).

We claim:

1. A line decoder for memory devices, comprising:
    a decoding stage including at least one decoding circuit;
    a first line at a first reference potential;
    a second line switchable between said first reference potential and a second reference potential higher than the first;
    a third line at a third reference potential lower than said first reference potential;
    wherein said decoding circuit comprises:
        a first path connected to said first line;
        a second path connected to said second line; and
        a switching stage for selectively enabling said first path and said second path, the first and second signal paths being parallel-connected between the same input and output terminals of the decoding stage.

2. The decoder as claimed in claim 1 wherein: the decoder is a row decoder; said decoding stage forms a predecoding stage; said decoding circuit forms a predecoding circuit; and the decoder further comprises a final decoding stage cascade-connected to said predecoding stage and comprising at least one decoding circuit.

3. The decoder as claimed in claim 2 wherein said predecoding circuit comprises a combinatorial circuit connected to said first line and said third line and an output circuit connected to said second line and said third line; said combinatorial circuit receiving a number of address signals, and generating a first predecoding signal switchable between said first and third reference potentials; and wherein said first and second paths are interposed between said combinatorial circuit and said output circuit; said first path receiving said first predecoding signal, and generating a second predecoding signal switchable between said first and third reference potentials; and said second path receiving said first predecoding signal, and generating a third predecoding signal switchable between said second and third reference potentials.

4. The decoder as claimed in claim 3 wherein said switching stage comprises a control circuit having an input receiving a selection signal switchable between a first and second level, and a first and second output respectively supplying a first and second control signal; a first switching element interposed between said combinatorial circuit and said first path, and controlled by said first control signal; and a second switching element interposed between said second path and said second line, and controlled by said second control signal.

5. The decoder as claimed in claim 4 wherein said first switching element comprises a CMOS switch having a first and second control terminal receiving signals in counter phase.

6. The decoder as claimed in claim 5 wherein said control circuit comprises a first voltage shifting element having an input terminal connected to said input of said switching stage, and an output connected to said first control terminal of said CMOS switch; said voltage shifting element being connected to said second and third lines to supply at said output said third reference potential in the presence of said first level of said selection signal, and said second reference potential in the presence of said second level of said selection signal.

7. The decoder as claimed in claim 5 wherein said second terminal of said CMOS switch is connected to said input of said control circuit.

8. The decoder as claimed in claim 5 wherein said CMOS switch comprises a PMOS transistor with a body region connected to said second line.

9. The decoder as claimed in claim 4 wherein said second path comprises a second voltage shifting element having an input terminal connected to said input of said control circuit and to an output of said combinatorial circuit, and an output connected to said output circuit; said second voltage shifting element also being connected to said second and third lines to generate said third predecoding signal at said second reference potential in the presence of said second level of said selection signal and a first value of said first predecoding signal, and at said third reference potential in the presence of said second level of said selection signal and a second value of said first predecoding signal.

10. The decoder as claimed in claim 9 wherein said second switching element comprises a MOS transistor interposed between said second voltage shifting element and said second line, and having a control terminal receiving said selection signal.

11. The decoder as claimed in claim 2 wherein said final decoding stage comprises an input circuit, and a number of drive circuits connected to said input circuit and to a respective array row; said input circuit and said drive circuits being connected to said second and third lines.

12. The decoder as claimed in claim 11 wherein said input circuit comprises logic means having a plurality of inputs connected to a number of predecoding circuits, and an output; and in that each drive circuit comprises a first inverting element having an input connected to a respective predecoding circuit, and an output; said final decoding stage comprising at least one disabling element connected between said second line and said output of said first inverting element, and having a control terminal connected to said output of said logic means.

13. The decoder as claimed in claim 12 wherein said final decoding stage comprises at least one enabling element interposed between said third line and said first inverting element of said drive circuits, and having a control terminal connected to said output of said logic means.

14. The decoder as claimed in claim 13 wherein said disabling and enabling elements comprise respective complementary MOS transistors.

15. The decoder as claimed in claim 12 wherein each said drive circuit comprises a second inverting element cascade-connected to said first inverting element and connected between said second line and a fourth line switchable between said third potential and a fourth potential lower than said third potential.

16. The decoder as claimed in claim 15 wherein said second inverting element comprises a PMOS transistor and an NMOS transistor having respective first terminals connected to each other, and respective second terminals connected respectively to said second and fourth lines; said NMOS transistor being formed using triple-well technology.

17. The line decoder according to claim 1 wherein the first path is used during reading and provides an output having a signal at the first reference potential and the second path is used during programming and provides an output with the signal having the second reference potential, higher than the first reference potential.

18. A line decoder for memory devices, comprising:
a decoding stage including at least one decoding circuit;
a first line at a first reference potential;
a second line switchable between said first reference potential and a second reference potential higher than the first;
a third line at a third reference potential lower than said first reference potential;
wherein said decoding circuit comprises:
a first path connected to said first line;
a second path connected to said second line; and
a switching stage for selectively enabling said first path and said second path, and further, wherein said decoding circuit includes a combinatorial circuit connected to said first line and said third line and an output circuit connected to said second line and said third line, said combinatorial circuit receiving a plurality of address signals, and generating a first decoding signal switchable between first and third reference potentials and wherein said first and second paths are interposed between said combinatorial circuit and said output circuit, said first path receiving said first decoding signal, and generating a second decoding signal switchable between said first and third reference potentials, and said second path receiving said first decoding signal, and generating a third decoding signal switchable between said second and third reference potentials.

19. A line decoder for memory devices, comprising:
a decoding stage including at least one decoding circuit;
a first line at a first reference potential;
a second line switchable between said first reference potential and a second reference potential higher than the first;
a third line at a third reference potential lower than said first reference potential;
wherein said decoding circuit comprises:
a first path connected to said first line;
a second path connected to said second line; and
a switching stage for selectively enabling said first path and said second;
wherein the decoding stage forms a predecoding stage and the decoding circuit forms a predecoding circuit; and the decoder further comprises a final decoding stage cascade-connected to said predecoding stage and comprising at least one decoding circuit, the final decoding stage being an input circuit and having a plurality of drive circuits connected to said input circuit and to a respective array address line, said input circuits and said drive circuits being connected to said second and third lines.

20. The decoder according to claim 19 wherein said respective address line is a row address line.

21. The decoder according to claim 19 wherein said respective address line is a column address line.

* * * * *